(12) United States Patent
Shima et al.

(10) Patent No.: US 11,973,146 B2
(45) Date of Patent: Apr. 30, 2024

(54) SEMICONDUCTOR INTEGRATED CIRCUIT

(71) Applicant: KABUSHIKI KAISHA TOKAI-RIKA-DENKI-SEISAKUSHO, Aichi-ken (JP)

(72) Inventors: Kengo Shima, Aichi (JP); Yoshikazu Kataoka, Aichi (JP); Kazuya Adachi, Aichi (JP); Yuto Hakamata, Aichi (JP)

(73) Assignee: KABUSHIKI KAISHA TOKAI-RIKA-DENKI-SEISAKUSHO, Aichi-ken (JP)

( * ) Notice: Subject to any disclaimer, the term of this patent is extended or adjusted under 35 U.S.C. 154(b) by 197 days.

(21) Appl. No.: 17/771,134

(22) PCT Filed: Oct. 27, 2020

(86) PCT No.: PCT/JP2020/040320
§ 371 (c)(1),
(2) Date: Apr. 22, 2022

(87) PCT Pub. No.: WO2021/085437
PCT Pub. Date: May 6, 2021

(65) Prior Publication Data
US 2022/0302323 A1    Sep. 22, 2022

(30) Foreign Application Priority Data
Nov. 1, 2019   (JP) .................................. 2019-200243

(51) Int. Cl.
*H01L 29/86* (2006.01)
*H01L 27/12* (2006.01)
(Continued)

(52) U.S. Cl.
CPC ...... *H01L 29/8611* (2013.01); *H01L 27/1203* (2013.01); *H01L 29/0657* (2013.01); *H01L 29/7838* (2013.01); *H01L 29/78603* (2013.01)

(58) Field of Classification Search
None
See application file for complete search history.

(56) References Cited

U.S. PATENT DOCUMENTS

| 5,294,825 A | 3/1994 | Nakagawa et al. |
| 5,378,920 A * | 1/1995 | Nakagawa .......... H01L 29/7436 |
| | | 257/E29.279 |

(Continued)

FOREIGN PATENT DOCUMENTS

| JP | H01-103851 | 4/1989 |
| JP | H05-136436 | 6/1993 |

(Continued)

OTHER PUBLICATIONS

PCT International Search Report (w/ English translation) for corresponding Application No. PCT/JP2020/040320, dated Dec. 28, 2020, 5 pages.

*Primary Examiner* — Bilkis Jahan
(74) *Attorney, Agent, or Firm* — Dority & Manning, P.A.

(57) ABSTRACT

A semiconductor integrated circuit including: a substrate of a first conductivity type; a buried insulating film provided on the substrate; an active layer of the first conductivity type provided on the buried insulating film; a first impurity region of a second conductivity type formed within the active layer; an electric field relaxation layer of the second conductivity type formed within the active layer and surrounding the first impurity region; a second impurity region of the first conductivity type formed within the active layer and surrounding the electric field relaxation layer; and a groove formed surrounding the second impurity region and reaching the buried insulating film.

5 Claims, 2 Drawing Sheets

(51) Int. Cl.
    *H01L 29/06*      (2006.01)
    *H01L 29/78*      (2006.01)
    *H01L 29/786*     (2006.01)
    *H01L 29/861*     (2006.01)

(56) References Cited

U.S. PATENT DOCUMENTS

| | | | |
|---|---|---|---|
| 6,933,559 B1* | 8/2005 | Van Roijen | H01L 29/7816 |
| | | | 257/E29.066 |
| 2004/0227188 A1 | 11/2004 | Terashima | |
| 2005/0212042 A1 | 9/2005 | Terashima | |
| 2008/0290443 A1 | 11/2008 | Terashima | |
| 2012/0267750 A1* | 10/2012 | Imai | H01L 27/0922 |
| | | | 257/E29.023 |
| 2013/0075877 A1 | 3/2013 | Sakai et al. | |
| 2013/0256746 A1* | 10/2013 | Nakamura | H01L 29/66106 |
| | | | 257/140 |
| 2014/0145290 A1* | 5/2014 | Gu | H01L 29/872 |
| | | | 438/570 |
| 2017/0077082 A1* | 3/2017 | Marreiro | H01L 27/0262 |
| 2020/0321329 A1* | 10/2020 | Laconde | H01L 29/0649 |

FOREIGN PATENT DOCUMENTS

| | | |
|---|---|---|
| JP | 2004-335922 | 11/2004 |
| JP | 2013-084903 | 5/2013 |

* cited by examiner

SEMICONDUCTOR INTEGRATED CIRCUIT

CROSS-REFERENCE TO RELATED APPLICATIONS

The present application is related and has right of priority to JP 2019-200243, which was filed on Nov. 1, 2019 in the Japanese Patent Office, and is a U.S. national phase entry of PCT/JP2020/040320, which was filed on Oct. 27, 2020, both of which are incorporated by reference in their entireties for all purposes.

TECHNICAL FIELD

The present disclosure relates to a semiconductor integrated circuit, and particularly to a semiconductor integrated circuit including a high withstand voltage diode having an SOI structure.

BACKGROUND ART

As a conventional technique relating to a high withstand voltage diode, for example, a semiconductor device disclosed in Japanese Patent Application Laid-Open (JP-A) No. 2004-335922 is known. In the semiconductor device described in JP-A No. 2004-335922, a diode including a first P-type region 11, an N+ type region 12, and an N− type region 13 is formed in a semiconductor layer 10 on a buried oxide (BOX) layer 2. A second P-type region 14 is formed at the bottom of the semiconductor layer 10, and the second P-type region 14 is divided into a plurality of parts by an insulating oxide film 21. In this configuration, in a case in which the diode is in the reverse bias state, the second P-type region 14 immediately below the N+ type region 12 has substantially the same voltage as that of the first N+ type region 12. Then, the potential of the second P-type region 14 decreases toward the first P-type region 11. As a result, an electric field concentration at an interface between the semiconductor layer 10 and the BOX layer 2 is relaxed, and the withstand voltage of the diode can be increased.

SUMMARY OF INVENTION

Technical Problem

However, in the semiconductor device according to JP-A No. 2004-335922, since a special structure, in which the second P-type region 14 divided into the plurality of parts by the insulating oxide film 21, is required, a process of manufacturing a silicon on insulator (SOI) wafer becomes complex, and as a result, there is a problem that the cost increases. In addition, since the semiconductor device according to JP-A No. 2004-335922 has a complex structure, there is room for improvement from the viewpoint of miniaturization. Furthermore, since the N− type region 13 has a structure in contact with the BOX layer 2, there is a problem that in a case in which a negative bias is applied to the diode, the diode is not depleted, and in a case in which the film thickness of the BOX layer 2 is small, it is difficult to secure a withstand voltage.

In general, the allowable voltage of the BOX layer depends on the film thickness of the BOX layer, and the allowable voltage is larger in a case in which the film thickness is larger. On the other hand, the film thickness of the BOX layer depends on the manufacturing process and the like, and the film thickness that can be adopted is naturally limited. That is, there is also a limit to the voltage that can be borne by the BOX layer. In this regard, in the diode according to JP-A No. 2004-335922, it is difficult to secure a withstand voltage equal to or higher than the voltage borne by the BOX layer, and thus, there is a problem that the film thickness of the BOX layer has to be increased (for example, about 6 μm).

Therefore, in the semiconductor integrated circuit having the SOI structure in which the film thickness of the BOX layer is small, a semiconductor integrated circuit capable of securing a sufficient withstand voltage in a case in which, for example, a negative bias is applied with a simple configuration capable of being downsized, particularly, a diode, has been required.

In consideration of the above fact, an object of an embodiment of the present disclosure is to provide a semiconductor integrated circuit capable of improving a withstand voltage with a simple configuration and capable of being downsized.

Solution to Problem

A semiconductor integrated circuit according to a first aspect of the present disclosure includes: a substrate of a first conductivity type; a buried insulating film provided on the substrate; an active layer of the first conductivity type provided on the buried insulating film; a first impurity region of a second conductivity type formed within the active layer; an electric field relaxation layer of the second conductivity type formed within the active layer and surrounding the first impurity region; a second impurity region of the first conductivity type formed within the active layer and surrounding the electric field relaxation layer; and a groove formed surrounding the second impurity region and reaching the buried insulating film.

The semiconductor integrated circuit according to the first aspect includes the buried insulating film, the active layer of the first conductivity type formed on the buried insulating film, and the first impurity region of the second conductivity type formed in the active layer.

In this case, a PN junction exists at an interface between the active layer of the first conductivity type and the first impurity region of the second conductivity type, and a diode is formed. Since the electric field relaxation layer of the second conductivity type is further provided surrounding the first impurity region, a depletion layer is expanded, and as a result, a withstand voltage may be improved.

In a semiconductor integrated circuit according to a second aspect of the present disclosure, the semiconductor integrated circuit according to the first aspect further includes an oxide film formed on an inner surface of the groove, and a third impurity region of the second conductivity type formed in the active layer so as to surround the second impurity region and be adjacent to the oxide film.

The semiconductor integrated circuit according to the second aspect of the present disclosure further includes the oxide film formed on the inner surface of the groove, and the third impurity region of the second conductivity type formed in the active layer so as to surround the second impurity region and be adjacent to the oxide film. Since the third impurity region functions as a channel stopper, a decrease in the withstand voltage may be suppressed.

In a semiconductor integrated circuit according to a third aspect of the present disclosure, the semiconductor integrated circuit according to the second aspect further includes: a conductor formed inside the groove via the oxide film, and a depletion layer is formed over the entire active layer in a case in which a first potential is applied to the first impurity region and the conductor and a second potential lower than the first potential is applied to the second impurity region.

In the semiconductor integrated circuit according to the third aspect, the depletion layer is formed over the entire active layer in a case in which the first potential is applied to the first impurity region and the conductor and the second potential lower than the first potential is applied to the second impurity region. Therefore, in a case in which a negative bias is applied, the entire active layer is depleted, and the withstand voltage may be more efficiently improved.

In a semiconductor integrated circuit according to a fourth aspect of the present disclosure, in the semiconductor integrated circuit according to the second aspect or the third aspect, an external shape of the substrate in plan view is a track shape, and each of the electric field relaxation layer, the second impurity region, the groove, and the third impurity region is formed in a track shape along the external shape of the substrate.

According to the semiconductor integrated circuit according to the fourth aspect, the entire semiconductor integrated circuit is formed in a track shape. Therefore, the withstand voltage may be improved without depending on a cross-sectional direction of the semiconductor integrated circuit.

In a semiconductor integrated circuit according to a fifth aspect of the present disclosure, in the semiconductor integrated circuit according to any one of the first to fourth aspects, the first conductivity type is a P type, and the second conductivity type is an N type.

According to the semiconductor integrated circuit according to the fifth aspect, the active layer is of the P type. Therefore, it is possible to form a semiconductor integrated circuit in which an anode region is arranged to surround a cathode region.

Advantageous Effects of Invention

According to the embodiment of the present disclosure, there is an excellent effect in which it is possible to provide a semiconductor integrated circuit capable of improving a withstand voltage with a simple configuration and capable of being downsized.

DESCRIPTION OF EMBODIMENTS

Figure 1A:
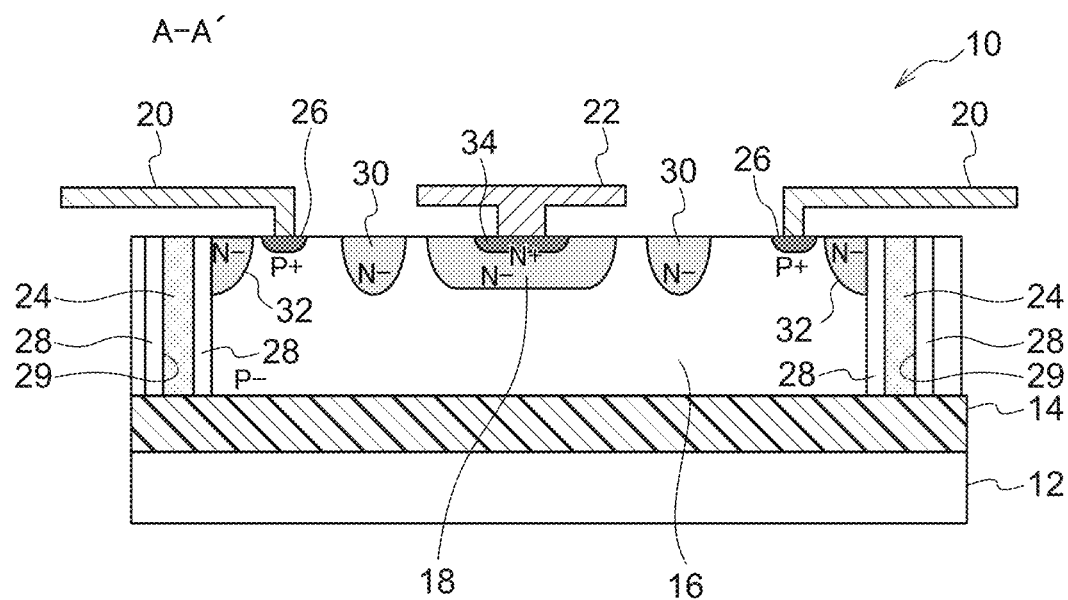
FIG. 1A is a cross-sectional view illustrating an example of a configuration of a semiconductor integrated circuit according to an embodiment of the present disclosure.

Hereinafter, a semiconductor integrated circuit according to an embodiment of the present disclosure will be described with reference to FIGS. 1A, 1B, and 2. In the following embodiment, an embodiment in which the semiconductor integrated circuit according to the present disclosure is applied to a high withstand voltage diode will be described as an example. In addition, the semiconductor integrated circuit according to the present embodiment is manufactured by adopting a deep trench isolation (DTI) technology using an SOI wafer, as an example. That is, the semiconductor integrated circuit according to the present embodiment includes a trench (groove) reaching the BOX layer of the SOI wafer. In this case, in the present embodiment, as a specific example of a "high withstand voltage", 600 V or more is assumed. In the drawings, the same or equivalent components and portions are denoted by the same reference signs, and redundant description will be omitted as appropriate.

Figure 1B:
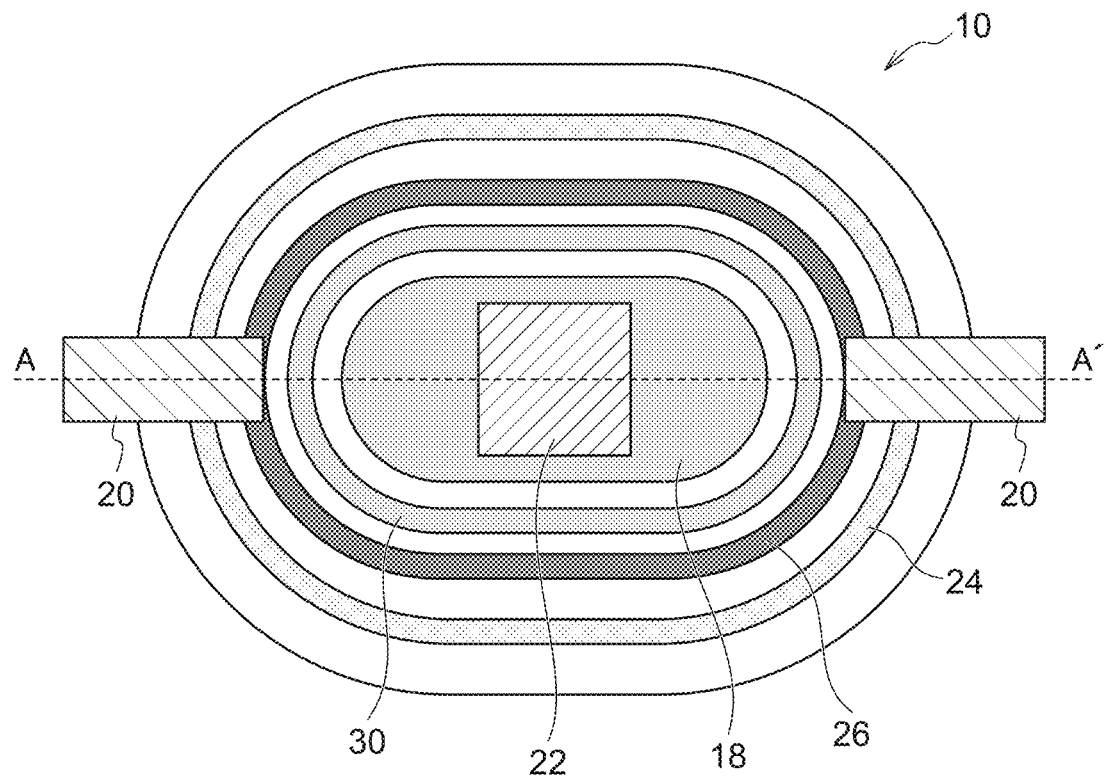
FIG. 1B is a plan view illustrating an example of the configuration of the semiconductor integrated circuit according to the embodiment of the present disclosure.

FIG. 1A illustrates an example of a cross-sectional view of a semiconductor integrated circuit 10 according to the present embodiment, and FIG. 1B illustrates an example of a plan view of the semiconductor integrated circuit 10. FIG. 1A is a cross-sectional view of the semiconductor integrated circuit 10 taken along line A-A' illustrated in FIG. 1B. However, in FIG. 1B, a part of the configuration illustrated in FIG. 1A is omitted. As illustrated in FIG. 1A, the semiconductor integrated circuit 10 includes a semiconductor substrate 12, a buried insulating film 14, a P-type impurity region 16, an N-type impurity region 18, an anode electrode 20, and a cathode electrode 22.

As described above, the semiconductor integrated circuit 10 according to the present embodiment is manufactured using an SOI wafer, as an example. That is, the semiconductor substrate 12 is a P-type (P−) silicon substrate, as an example, and the buried insulating film 14 is a so-called BOX layer. Each of the P-type impurity region 16 (P−) and the N-type impurity region 18 (N−) is formed in a silicon semiconductor layer included in the SOI wafer. The P-type impurity region 16 is a part of a layer constituting an anode of the semiconductor integrated circuit 10, and is connected to the anode electrode 20 via a P+ contact region 26.

The N-type impurity region 18 is a part of a layer constituting a cathode of the semiconductor integrated circuit 10, and is connected to the cathode electrode 22 via an N+ contact region 34. A PN junction is formed at an interface between the P-type impurity region 16 and the N-type impurity region 18. In this case, in the present embodiment, P− means a P-type impurity region having a relatively low concentration. P+ means a P-type impurity region having a relatively high concentration, N− means an N-type impurity region having a relatively low concentration, and N+ means an N-type impurity region having a relatively high concentration.

The semiconductor integrated circuit 10 further includes polysilicon 24 and an oxide film 28.

The polysilicon 24 is formed by filling a trench 29 (groove) formed in the silicon semiconductor layer of the SOI wafer. As an example, the trench 29 according to the present embodiment has a depth reaching the buried insulating film 14. The oxide film 28 is formed on an inner wall including the bottom of the trench 29 using, for example, a silicon oxide film (SiO2). For example, the semiconductor integrated circuit 10 can be easily separated from other circuit elements by the trench 29. By filling the trench 29 with the polysilicon 24, a bias voltage (ground potential in the present embodiment) can be applied to the polysilicon 24 connected to the buried insulating film 14 as described later. The "polysilicon 24" is an example of a "conductor" according to the present disclosure.

The semiconductor integrated circuit 10 further includes an N− impurity region 30 and an N− impurity region 32, and details of the N− impurity region 30 and the N− impurity region 32 will be described later.

As illustrated in FIG. 1B, the semiconductor integrated circuit 10 according to the present embodiment has a track shape in which semicircles are connected to both sides of a rectangular portion in plan view. The N− impurity region 30 is formed to surround the N-type impurity region 18, the P+ contact region 26 is formed to surround the N− impurity region 30, and the polysilicon 24 is formed to surround the P+ contact region 26.

Note that the N− impurity region 32 not illustrated in FIG. 1B is also formed between the P+ contact region 26 and the polysilicon 24 to surround the P+ contact region 26.

As illustrated in FIG. 1B, in the semiconductor integrated circuit 10, the cathode electrode 22 is arranged surrounded by the plurality of impurity regions. Therefore, in a case in which the semiconductor integrated circuit 10 is mounted on a package or the like, the cathode electrode 22 is connected to an external terminal using, for example, a bonding wire. That is, the cathode electrode 22 has a function of an electrode pad. On the other hand, as illustrated in FIG. 1B, the anode electrode 20 is configured to extend to the outside of the semiconductor integrated circuit 10, and is connected to the electrode pad at an extension destination.

Next, a method of applying a bias voltage to the semiconductor integrated circuit 10 will be described with reference to FIG. 2. FIG. 2 illustrates how a power supply 36 is connected in a case where a negative bias (reverse bias) is applied as an example of the method of applying a bias voltage. That is, as illustrated in FIG. 2, the positive electrode of the power supply 36 is connected to the cathode electrode 22 connected to GND (ground), and the negative electrode is connected to the anode electrode 20. In this case, the semiconductor substrate 12 and the polysilicon 24 are also connected to GND.

In this case, in a case in which the voltage of the power supply 36 is Vb, since a voltage −Vb is applied to the anode electrode 20 and the potential of the cathode electrode 22 is 0 V, the potential difference between terminals of the semiconductor integrated circuit 10 as a diode is Vb. Note that, the application of the negative bias to the semiconductor integrated circuit 10 illustrated in FIG. 2 is performed, for example, in a case in which the semiconductor integrated circuit 10 is used as an electrostatic protection element.

In this case, in the semiconductor integrated circuit 10, the PN junction is formed at the interface between the P-type impurity region 16 and the N-type impurity region 18. As illustrated in FIG. 2, in a case in which the negative bias is applied to the semiconductor integrated circuit 10, a depletion layer DLT is formed starting from the PN junction. In the semiconductor integrated circuit 10, a semiconductor layer (active layer) forming a diode is P-type of the P-type impurity region 16.

Therefore, in a case in which a negative bias is applied to the semiconductor substrate 12 at the GND potential facing each other with the buried insulating film 14 interposed therebetween, the P-type impurity region 16 is depleted up to the vicinity of the interface in contact with the buried insulating film 14, and breakdown caused by the potential difference between the semiconductor substrate 12 and the P-type impurity region 16 is suppressed. Therefore, the film thickness of the buried insulating film 14 (BOX layer) can be reduced (for example, the thickness is reduced to about 4 μm) as compared with the conventional technique. This point is fundamentally different from the semiconductor device according to JP-A No. 2004-335922 described above in which a withstand voltage is secured by an insulating structure in contact with the BOX layer 2.

In addition, the semiconductor integrated circuit 10 has a configuration in which breakdown is suppressed even in the vicinity of the trench 29, similarly to the above effect. That is, since a negative potential is applied to the P-type impurity region 16 and the polysilicon 24 is connected to GND, the P-type impurity region 16 is depleted via the oxide film 28, and breakdown at the peripheral edge portion of the P-type impurity region 16 is suppressed. That is, the semiconductor integrated circuit 10 is configured such that a depletion layer is formed over the entire P-type impurity region 16. As a result, a high withstand voltage can be secured even with the buried insulating film 14 (BOX layer) having a thickness (for example, 4 μm) smaller than that of the conventional technique.

Figure 2:
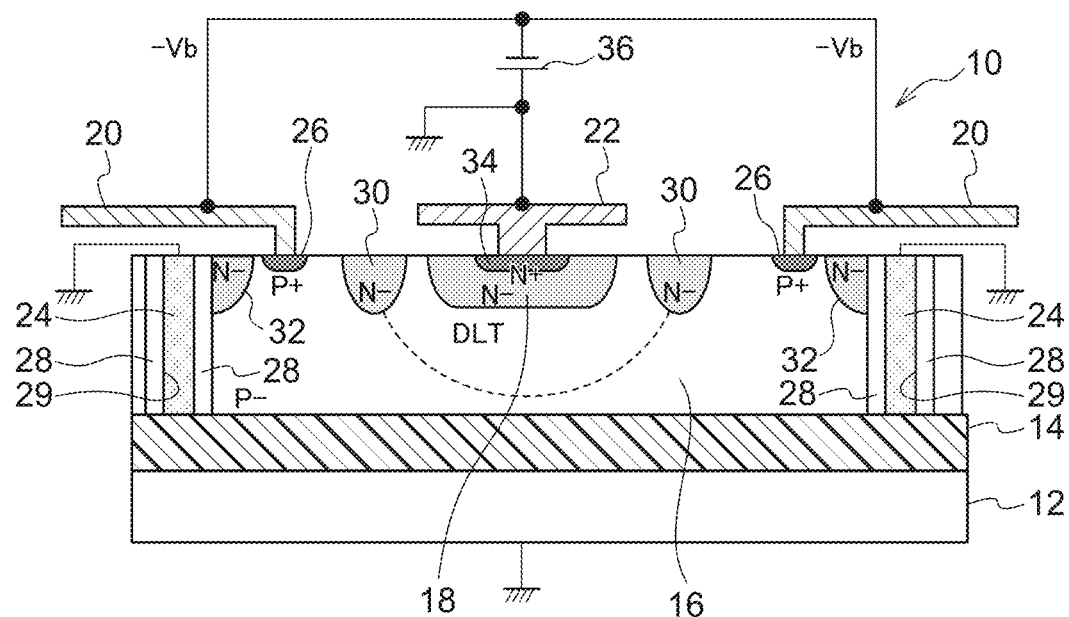
FIG. 2 is a cross-sectional view illustrating a method of applying a bias in the semiconductor integrated circuit according to the embodiment of the present disclosure.

The N− impurity region 30 illustrated in FIG. 2 functions as an electric field relaxation layer. That is, the N− impurity region 30 has the same effect as the N-type impurity region 18 on the depletion layer DLT, and has an effect of expanding the depletion layer DLT. That is, the N− impurity region 30 is integrated with the depletion layer DLT formed for the N-type impurity region 18, and further coupled to the depletion layer at the vicinity of the trench 29 described above, and has an effect of widening the depletion layer DLT in the lateral direction (left-right direction on the paper of FIG. 2). Note that the N− impurity region 30 may be provided in consideration of a withstand voltage and the like required for the semiconductor integrated circuit 10, and is not essential.

A negative bias is applied to the wiring of the anode electrode 20, and the P+ layer (P+ contact region 26) near the surface of the semiconductor integrated circuit 10 and the P-layer (P-type impurity region 16) are equipotential. Therefore, in the semiconductor integrated circuit 10 according to the present embodiment, the bias effect by the wiring (anode electrode 20) is hardly received. However, in the peripheral edge portion of the semiconductor integrated circuit 10, the potential of the P-type impurity region 16 is higher (close to GND) than that of the wiring of the anode electrode 20. Therefore, it is also assumed that a P-type accumulation effect occurs, and a P-type accumulation effect region is in contact with the depletion layer DLT in the peripheral portion of the trench 29, thereby decreasing the withstand voltage of the semiconductor integrated circuit 10. In the semiconductor integrated circuit 10, in order to suppress breakdown due to this mechanism, the N− impurity region 32 is formed at the periphery of the trench 29. That is, the N− impurity region 32 has a function as a channel stopper. In this case, the "bias effect" or the "accumulation effect" is also referred to as a "MOS effect", and means that a charge inversion layer is formed in a semiconductor layer under the wiring. Note that, the N− impurity region 32 may be provided in consideration of the withstand voltage and the like required for the semiconductor integrated circuit 10, and is not essential.

The semiconductor integrated circuit 10 according to the present embodiment has a track shape as illustrated in FIG. 1B in plan view in order to effectively achieve the effects of the above-described structure. That is, by forming the semiconductor integrated circuit 10 in a track shape, a cross-sectional structure in various directions can be the cross-sectional structure illustrated in FIG. 1A. That is, by eliminating the direction dependency of the cross-sectional structure of the semiconductor integrated circuit 10, the depletion layer DLT can isotropically expand, and the effect of improving the withstand voltage can be equally exerted in any direction. Note that, in the present embodiment, the embodiment in which the shape of the semiconductor integrated circuit 10 in plan view is a track shape has been described as an example, but the present invention is not limited thereto, and an embodiment using another shape such as a circular shape or an elliptical shape may be used. However, it is preferable that the shape does not have a corner.

As described above in detail, according to the semiconductor integrated circuit according to the present embodiment having the above configuration, it is possible to configure a semiconductor integrated circuit (diode) capable of securing a high withstand voltage with a structure having a smaller occupied area without making the structure of the SOI wafer complex as in the conventional technique.

In the above embodiment, as an example, a case in which the P-type semiconductor substrate is used has been described, however, an N-type substrate may be used. In this case, in the above description, P-type may be replaced with N-type, and N-type may be replaced with P-type.

The disclosure of Japanese Patent Application No. 2019-200243 filed on Nov. 1, 2019, is incorporated herein by reference in its entirety.

All the documents, patent applications, and technical standards described in this specification are incorporated herein by reference to the same extent as if each individual document, patent application, and technical standard were specifically and individually indicated to be incorporated by reference.

The invention claimed is:

1. A semiconductor integrated circuit comprising:
   a substrate of a first conductivity type;
   a buried insulating film provided on the substrate;
   an active layer of the first conductivity type provided on the buried insulating film;
   a first impurity region of a second conductivity type formed within the active layer;
   an electric field relaxation layer of the second conductivity type formed within the active layer and surrounding the first impurity region;
   a second impurity region of the first conductivity type formed within the active layer and surrounding the electric field relaxation layer; and
   a groove formed surrounding the second impurity region and reaching the buried insulating film.

2. The semiconductor integrated circuit according to claim 1, further comprising:
   an oxide film formed on an inner surface of the groove; and
   a third impurity region of the second conductivity type formed within the active layer so as to surround the second impurity region and disposed adjacent to the oxide film.

3. The semiconductor integrated circuit according to claim 2, further comprising a conductor formed inside the groove via the oxide film,
   wherein a depletion layer is formed over the entire active layer in a case in which a first potential is applied to the substrate, the first impurity region, and the conductor, and a second potential lower than the first potential is applied to the second impurity region.

4. The semiconductor integrated circuit according to claim 2, wherein:
   an external shape of the substrate in plan view is a track shape, and
   each of the electric field relaxation layer, the second impurity region, the groove, and the third impurity region is formed in a track shape along the external shape of the substrate.

5. The semiconductor integrated circuit according to claim 1, wherein the first conductivity type is a P type, and the second conductivity type is an N type.

* * * * *